US012761247B2

(12) United States Patent
Amelio

(10) Patent No.: US 12,761,247 B2
(45) Date of Patent: Oct. 13, 2026

(54) TESTING HEAD WITH VERTICAL PROBES FOR A PROBE CARD AND CORRESPONDING METHOD OF ASSEMBLY

(71) Applicant: Microtest S.p.A., Vicopisano (IT)

(72) Inventor: Giuseppe Amelio, San Pietro (IT)

(73) Assignee: Microtest S.p.A., Vicopisano (IT)

( * ) Notice: Subject to any disclaimer, the term of this patent is extended or adjusted under 35 U.S.C. 154(b) by 54 days.

(21) Appl. No.: 18/484,773

(22) Filed: Oct. 11, 2023

(65) Prior Publication Data

US 2025/0123308 A1 Apr. 17, 2025

(51) Int. Cl.
*G01R 1/073* (2006.01)
*G01R 3/00* (2006.01)

(52) U.S. Cl.
CPC ........... *G01R 1/07371* (2013.01); *G01R 3/00* (2013.01)

(58) Field of Classification Search
None
See application file for complete search history.

(56) References Cited

U.S. PATENT DOCUMENTS 4,843,315 A * 6/1989 Bayer ................ G01R 1/07357 324/755.06
4,963,822 A * 10/1990 Prokopp ............ G01R 1/07328 324/763.01
5,367,254 A * 11/1994 Faure ................. G01R 1/07357 324/755.06
6,404,211 B2 * 6/2002 Hamel ............... G01R 1/07357 324/755.06
6,661,244 B2 * 12/2003 McQuade ................ G01R 3/00 324/762.03
7,274,197 B2 * 9/2007 Cram ................. G01R 1/07314 324/750.25
10,914,758 B2 * 2/2021 Yamazaki ................ G01R 3/00
11,009,523 B2 * 5/2021 Kato .................. G01R 1/06733
2004/0005792 A1 * 1/2004 Sabatier ............. G01R 1/07357 439/66
2005/0110506 A1 * 5/2005 Crippa ............... G01R 1/07357 324/754.11
2014/0118016 A1 * 5/2014 Breinlinger ........ G01R 1/07357 324/750.25
2017/0122983 A1 * 5/2017 Acconcia ........... G01R 1/07357

FOREIGN PATENT DOCUMENTS

CN 107580681 B * 6/2020 ......... G01R 1/06733
JP 5822042 B1 * 11/2015 ............. G01R 1/073
WO WO-2016157964 A1 * 10/2016 ............. G01R 1/073

* cited by examiner

*Primary Examiner* — Richard Isla
(74) *Attorney, Agent, or Firm* — Maier & Maier, PLLC

(57) ABSTRACT

A a testing head with vertical probes for a probe card, including: at least one pair of support and guide plates arranged parallel to each other in a prefixed spaced apart relation and provided with a plurality of guide and housing holes; a plurality of contact probes housed and extended between corresponding holes of the guide plates; at least one additional plate slidingly mounted next to one or the other of the guide plates and provided with one corresponding plurality of holes of the guide plates. The embodiments also relate to a method of assembly of the testing head.

13 Claims, 7 Drawing Sheets

TESTING HEAD WITH VERTICAL PROBES FOR A PROBE CARD AND CORRESPONDING METHOD OF ASSEMBLY

FIELD

The present invention relates to a so-called testing head having an improved structure for a probe card for performing tests on integrated electronic circuits, and to a corresponding method of assembly.

More particularly, the invention relates to a testing head of the type intended to put a plurality of terminations or pads of an integrated electronic circuit in contact with corresponding channels of a testing equipment to automatically perform some tests on the integrated electronic circuit. This equipment is used in the production phase of integrated electronic circuits to search for and discard any defective circuits.

BACKGROUND

As shown by way of example in FIG. 1 relating to the prior art, a testing head for a probe card of the above type usually comprises a pair of guide plates arranged parallel to each other in a prefixed spaced apart relation and provided with a plurality of guide and housing holes for probes or needles representing contact elements for the terminations of integrated circuits.

These contact probes of the testing head are made up of wires of special alloys which have peculiar electrical and mechanical properties, and which pass through the holes of the plates emerging from one of the two plates with an end or contact head.

The probes are mounted and held between the two plates in a position that is substantially perpendicular to the plates themselves so that, in the jargon of this specific technical field, they are defined “vertical probes”. This specific substantially vertical configuration allows incorporating a relatively high number of probes per unit area, so as to be able to perform tests even on integral circuits characterized by extremely low pitches, in the order of 30-40 μm for the latest generation integrated circuits.

More particularly, the holes of the respective plates through which a certain probe passes are generally slightly offset so that each probe is axially mobile through the respective housing holes, but with some friction which, along with the inherent flexibility of the probes themselves, confers a certain overall ability to withstand compression to the testing head assembly, as if it were slightly cushioned.

Examples of this type of testing heads are described in European patent no. EP 1 197 756 B1 and in international patent no. WO 2021/250598 in the name of the same Applicant.

In fact, in use, the testing head of the probe card is subjected to pressure to ensure good contact between the probe heads and the terminations of the integrated circuits being tested and this pressure produces a bending of the probes inside the separation space between the two parallel plates.

Their flexibility and/or the degree of axial sliding freedom of the probes through the respective guide holes of the plates is not only useful to confer the above bending ability to the entire testing head, but it is also useful to remove the probes in order to replace them in case of breakage.

In fact, it happens that one or more probes need to be singularly replaced in case of wear and without this implying the replacement of the entire testing head.

Usually, this maintenance operation is carried out manually, by means of a manipulator active even on a single probe; only in more rare cases is it possible to replace groups of probes by means of more sophisticated automatic pick-and-place equipment.

During the first assembly or replacement, the insertion of the probes into the guide holes of the plates, however, turns out to be critical: in fact, in particular at the lower plate, there is little clearance between probe and guide hole, which is necessary to ensure an exact positioning of the contact terminations on the corresponding pads under test of the integrated circuit. The introduction of the flexible needle into the above guide holes of relatively small diameter, also in view of the need to lead this needle through two holes on plates spaced apart by a separation space, proves to be concretely difficult.

The possible offset between the guide holes of the two plates further complicates the insertion task.

The technical problem underlying the present invention is to conceive a new structure of testing head for probe cards having structural and functional features such as to ensure an improved ability to assemble and/or replace probes, meanwhile ensuring the possibility to increase the number of probes mounted on a testing head.

Another object of the invention is to provide a testing head having clearances between the probes and the relative passage holes, which vary according to the needs.

A further object of the invention is to facilitate the replacement even of a single probe quickly and with modest operating costs.

SUMMARY

The solution idea underlying the present invention is to provide the possibility that the passage and housing holes of the probes in the support plates of the testing head have a variable section according to the operating status of the head itself.

Based on the above solution idea, the technical problem is solved by a testing head with vertical probes for a probe card comprising:

- at least one pair of guide plates arranged parallel to each other in a prefixed spaced apart relation and provided with a plurality of guide and housing holes;
- a plurality of contact probes housed and extended between corresponding holes of said guide plates; and
- at least one additional plate slidingly associated next to one or the other of said guide plates and provided with a plurality of openings, which define, in continuity with the holes of the associated guide plate, insertion passages for said probes, wherein the sliding of the additional plate with respect to the associated guide plate modifies a minimum section of said insertion passages.

In the context of the present invention, minimum section in particular indicates the lower section of the overall transversal port defined by holes and the overlapped openings so as to define the insertion passage.

Thanks to the above-described features, the holes of the guide plates may be sized in a larger way than those of the prior art, ensuring a wide clearance which greatly facilitates the introductions steps of the probe. Only at a later time, when the probe is housed in its position within the insertion passage, may the additional plate be translated like a portcullis to reduce the clearance between probe and passage as desired, thus increasing the precision of the assembled system.

Advantageously, the openings of the additional plate may be a plurality corresponding to the plurality of holes of the associated guide plate. In this case, the holes are substantially aligned except for possible differences in shape and related sliding.

Alternatively, it is possible to provide for the openings on the additional plate to be in a different number with respect to the holes of the guide plate. For instance, a smaller number of elongated grooves may be provided, each of which cooperates with a plurality of holes of the associated plate.

Advantageously, the above openings may have an axial extension, measured along a sliding direction of the additional plate, greater than that of the holes of the associated guide plate.

Preferably, said openings have at least one rectilinear edge that is perpendicular to the sliding direction, which thus may cooperate with the overlapped guide hole—of rectangular section—to define a variable port that is still rectangular.

Still preferably, at least one of the guide plates is structured with a first and a second plate-shaped portions that are parallel to each other, "sandwich"-configured and separated by a gap in which the additional plate slides.

More particularly, the thickness of the gap between the above plate-shaped "sandwich"-configured portions corresponds to the thickness of the additional plate, net of the clearance necessary for sliding.

In the described configuration, the guide holes are present—in substantial alignment-both on the upper portion and on the lower portion. The probe will thus be introduced between the aligned holes, which are provided with a relatively wide section, and successively the port of the insertion passage will be reduced by moving the additional plate.

It should also be noted that each of the two guide plates may be structured with a first and a second plate-shaped "sandwich"-configured portions and separated by a respective gap within which a corresponding additional plate slides.

In this way, the restriction mode of the guide hole by means of the additional plate may be reproduced both in the double top plate-PCB side—and in the double lower plate-wafer side.

Anyway, in a preferred embodiment, the sliding additional plate is only provided at the lower plate, whereas the major insertion criticalities are found in the prior art.

Should two additional plates be provided, the thickness of the gap between each pair of first and second plate-shaped "sandwich"-configured portions corresponds to the thickness of the related additional plate, even if the respective gaps may have different thicknesses.

Advantageously, the additional plate is slidingly guided between a non-operating position and an operating position, wherein the minimum section of the insertion passage in the assembly position is greater than the minimum section in the operating position.

Preferably, in the non-operating position, the port of the openings of the additional plate is wider than the projection of the port of the passage holes of the guide plates which it is associated with; in the operating position, instead, at least one edge of the passage holes of the guide plates partially masks said port of the additional plate.

Still preferably, said openings have opposite edges in the sliding direction of the additional plate; in said operating position one of said edges partially masks the port of the holes of the guide plate associated with the additional plate.

However, it should be noted that the sliding of said at least one additional plate is bidirectional and that the probes have at least one transversal enlargement capable of preventing the complete crossing of at least one of the guide holes of one of said guide plates.

The solution of the present disclosure also applies to the cases in which the respective guide and housing holes of the parallel support and guide plates are offset from each other.

The technical problem is also solved by a method of assembly of a testing head with vertical probes for a probe card comprising the steps of:

- providing at least one pair of guide plates arranged parallel to each other in a prefixed spaced apart relation and provided with a plurality of guide and housing holes;
- providing at least one additional plate slidingly associated next to one or the other of said guide plates and provided with a plurality of openings, which define, in continuity with the holes of the associated guide plate, insertion passages for probes, wherein the sliding of the additional plate with respect to the associated guide plate modifies a minimum section of said insertion passages;
- bringing said additional plate into a non-operating position, in which the minimum section of said insertion passages is maximum;
- introducing a plurality of contact probes between the corresponding holes of said guide plates, passing through said insertion passages; and
- bringing said additional plate into an operating position, in which the minimum section of said insertion passages, within which the probes are housed, is minimum.

The features and advantages of the testing head and of the corresponding method of assembly will become clearer from the description of an embodiment thereof given by way of non-limiting example with reference to the appended drawings.

DETAILED DESCRIPTION

Figure 1:
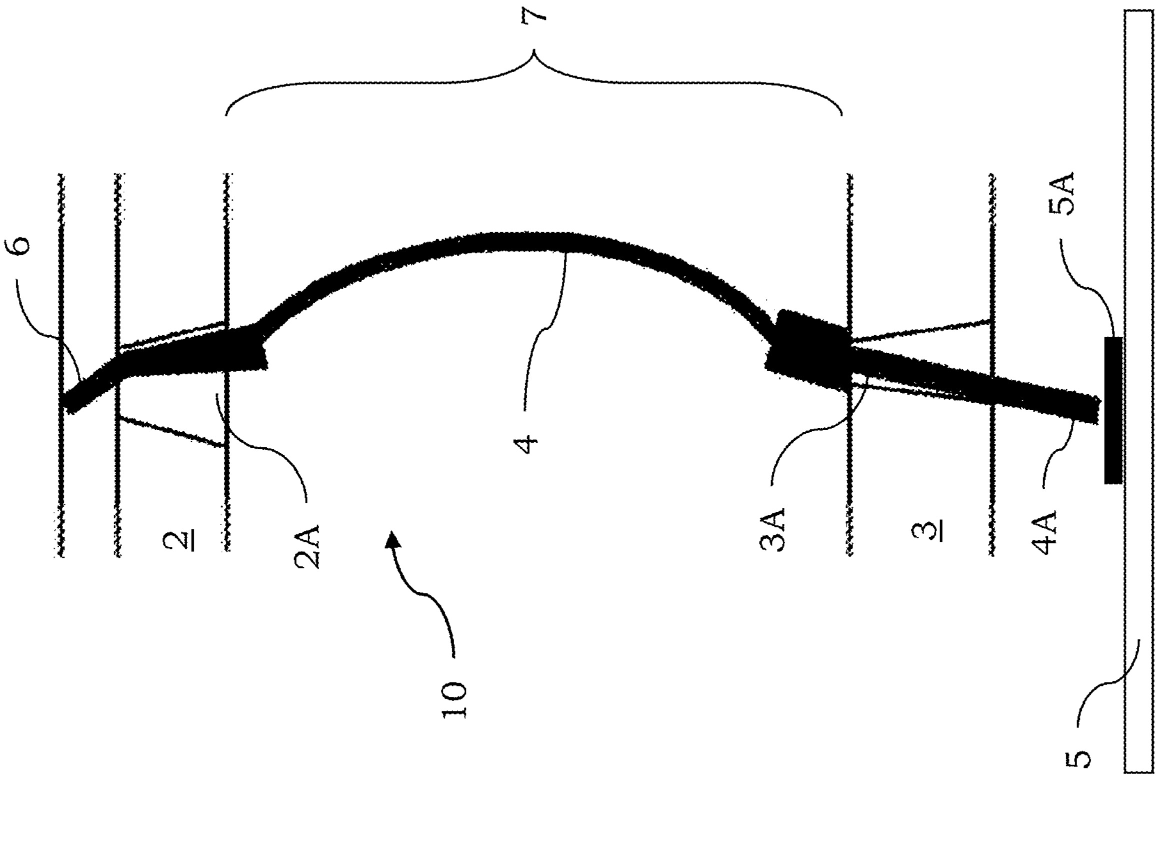
FIG. 1 PRIOR ART
FIG. 1 shows a schematic view of a testing head made according to the prior art.

With reference to the figures of the attached drawings, reference number 1 globally and schematically show a testing head with vertical probes for a so-called probe card, made according to the present disclosure.

It should be noted that the figures show schematic views and are not drawn on scale, but so as to emphasize the most important aspects and features of the present disclosure. The shapes of the elements and of the component parts of the testing head are also not binding.

In the technical jargon the testing head is also called probe head and is the termination structure of a probe card associated with a testing equipment; the probe head is provided to house the contact probes with the devices under test, which are usually integrated electronic circuits still arranged on wafers or other types of printed circuits.

Actually the probe card is an electromechanical interface between the testing equipment and a semi-conductor wafer, but in the drawings the entire equipment has not been shown since it is conventional and well-known in this technical field.

In the drawings (FIG. 1) instead, a testing head 10 of the known type is schematically shown, which comprises support plates 2, 3 and at least one probe 4 held in position by the plates, among the numerous probes that could be housed in parallel in the testing head.

The plate 2 is to be intended as a plate-shaped support or upper guide or “upper die”, whereas the plate 3 is to be intended as a plate-shaped or lower guide or “lower die”. The plates 2, 3 are usually made of ceramic material and have a plurality of upper 2A and lower 3A guide holes through which the above at least one contact probe 4 slides.

The definitions “upper” and “lower” relate to the main method of use of these testing heads, which are usually horizontally extended above a wafer under test with the plate 2 arranged above the plate 3, but this must not represent any limitation to the rights of the Applicant.

The upper plate 2 and the lower plate 3 are mounted parallel to each other and suitably spaced apart by a space 7 which is provided to allow the movement and/or the elastic deformation of the contact probes 4.

The contact probe 4 ends with a contact tip end 4A intended to abut onto a termination or contact pad 5A of a device under test 5 (Device Under Test=DUT), for instance a semiconductor wafer.

The probes 4 are in turn constrained to the upper plate 2 and are referred to as blocked-probe testing heads but, most commonly, the probes 4 are free to slide through the holes 2A and 3A, possibly with friction, to allow them to move between the plates. In some prior art solutions the probes are interfaced at the top to a so-called board via a contact board called “space transformer” or “interposer”, which allows the coupling with the probe card. The upper portion 6 of the probe is associated with the interposer.

The deformation of the probes within the space 7 and the sliding retainment with friction of the probes by the walls of the guide holes allows keeping the testing head cushioned during its use.

Figure 2A:
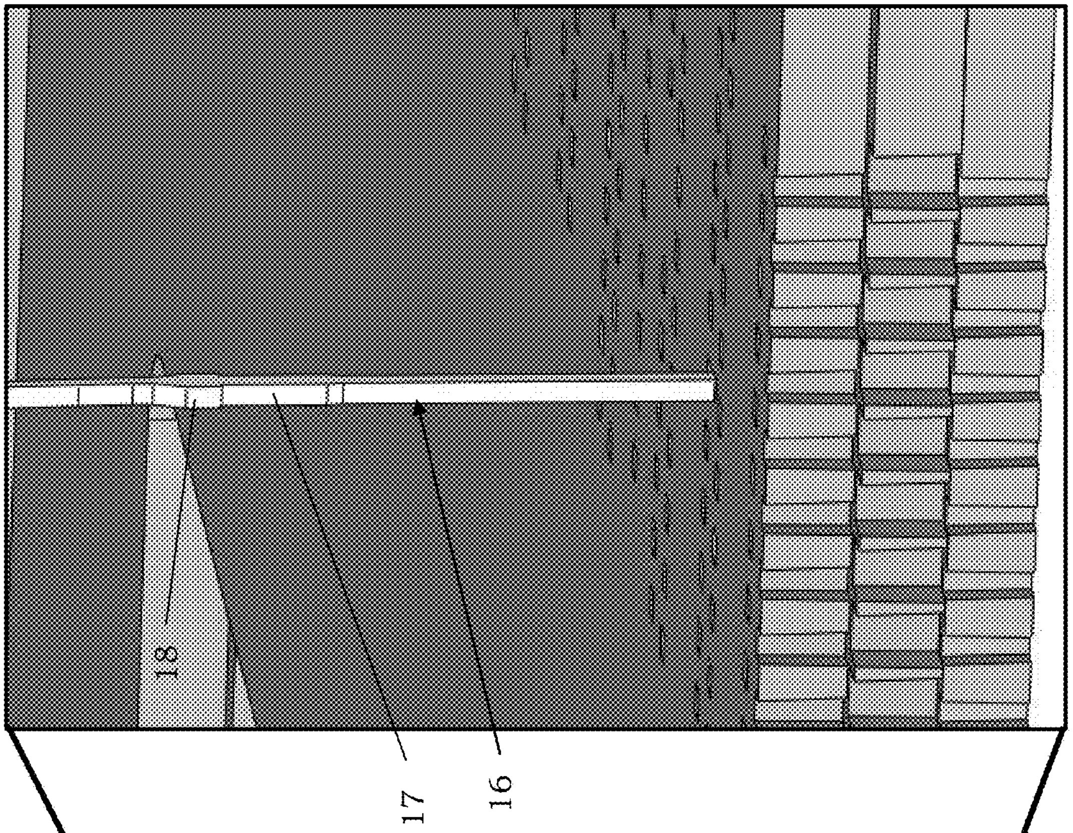
FIG. 2A shows a schematic enlarged-scale view of a detail of the example of FIG. 2.
Figure 2:
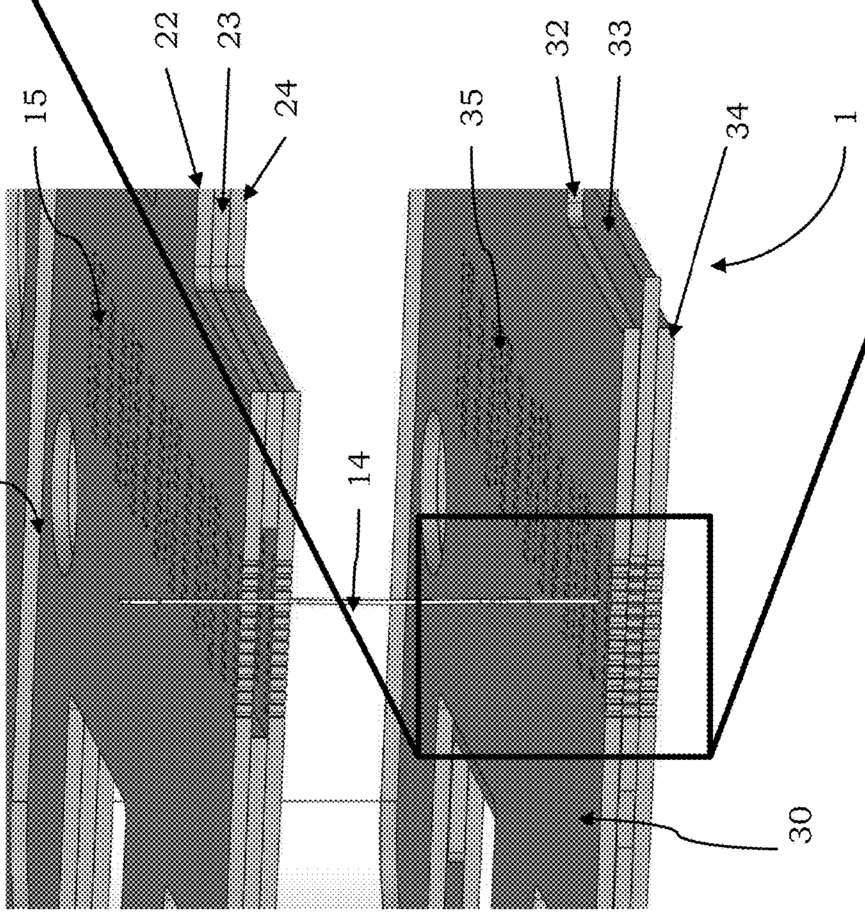
FIG. 2 shows a perspective, partial and schematic view of an embodiment of a testing head according to the present disclosure.

FIG. 2 shows a first exemplary embodiment of the present disclosure wherein a testing head 1 comprises at least one plate-shaped support 20 or upper probe guide and at least one plate-shaped support 30 or lower probe guide. These supports could be hereinafter simply referred to as guide plates.

Only by way of example it is pointed out that the thickness of these plate-shaped supports may vary from 200 μm to 500 μm.

The guide plates 20, 30 are planar and parallel to each other and are provided each with a plurality of guide holes 15 and 35 within which the contact probes 14 are slidingly housed. During the use of the testing head the plates 20, 30 are also parallel to a device under test.

Substantially the holes 15, 35 of the plates are equal in number and position so that the probes 14 may be slidingly housed in extension perpendicular with respect to the lying plane of the guide plates 20, 30. For this reason, they are usually referred to as testing heads with vertical probes, actually referring to the methods of use of these testing heads.

The example herein described may be of the shifted-plate type, namely the holes 15 and 35 of the upper and lower guide plates 20, 30, which are actually equal in the respective positions, may be slightly offset from each other. Anyway this optional feature is not binding for the purposes of the present disclosure.

In a preferred embodiment at least one additional plate 33 is slidingly mounted next to one 20 or the other 30 of said upper or lower guide plates and is provided with a corresponding plurality of openings 45 having a passage port different from the holes 15, 35 of said guide plates 20, 30.

The additional plate 23 or 33 is slidingly mounted by means of support means which are not shown in the drawings, but which may be considered conventional, such as for instance opposite longitudinal brackets associated with the long sides of the guide plates 20, 30. A skilled person comprises that other measures may be provided, such as for instance undercut or C-section guides associated with the long or short sides of the guide plates 20, 30.

With more particular reference to the example of FIG. 2, a respective additional plate 23, 33 is provided in association both with the upper guide plate 20, and with the lower guide plate 30; but if the additional plate 23 associated with the upper guide plate 20 is a simple fixed partition, the one 33 associated with the lower plate 30 is sliding and provided with openings 45.

The structure of the plate-shaped guide supports 20, 30 provides a “sandwich” configuration wherein for instance a first plate-shaped portion 22 and a second plate-shaped portion 24 are provided at the top, which are parallel constrained at a predetermined distance “S” from each other and with an interposed additional plate 23, 33, freely bidirectionally sliding in the case of the lower additional plate 33.

Essentially, it is as if the upper plate-shaped support 20 were made with at least one pair of plate-shaped portions 22, 24 constrained to each other and with an additional plate 23 interposed therebetween as a spacer.

Indicatively, each of the guide plates 22, 24, as well as the additional plate 23, have a thickness of at least 150 μm, typically 250 μm. The overall thickness is obviously equal to the thickness of the three plates, indicatively greater than 450 μm.

Figure 3B:
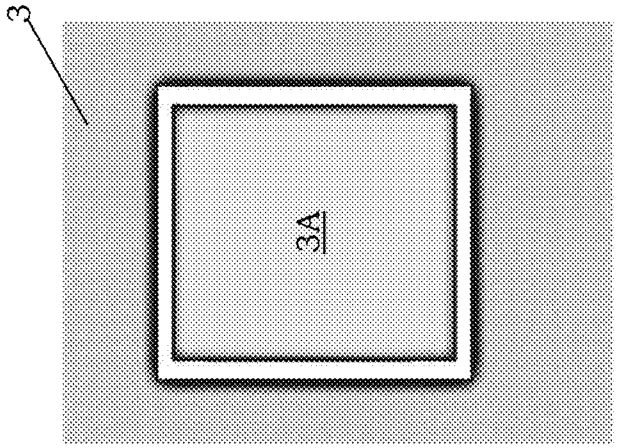
FIG. 3B is a schematic view of the coupling between probe and guide hole, in analogy with what is represented in FIG. 3A, in the prior art embodiments.
Figure 3A:
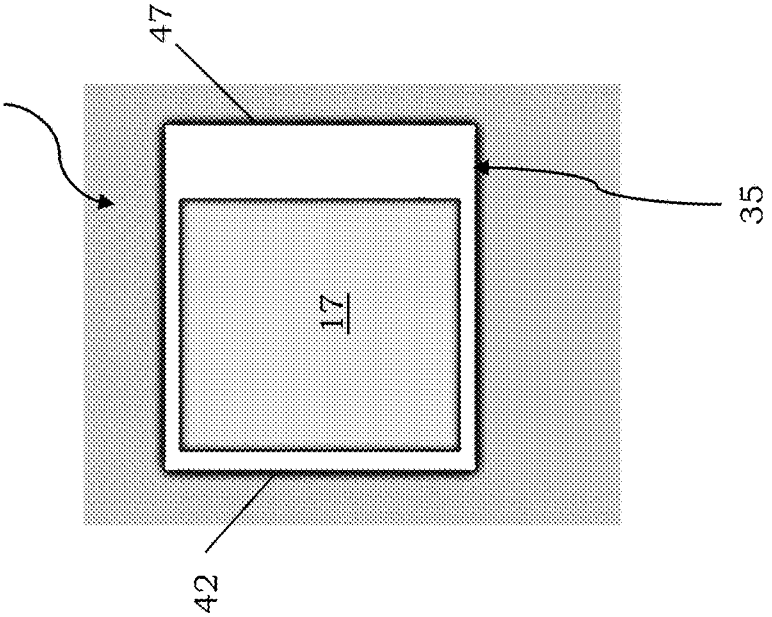
FIG. 3A is a schematic enlarged-scale view of a detail of the exemplary embodiment of FIG. 3 taken along the section A-A.
Figure 3:
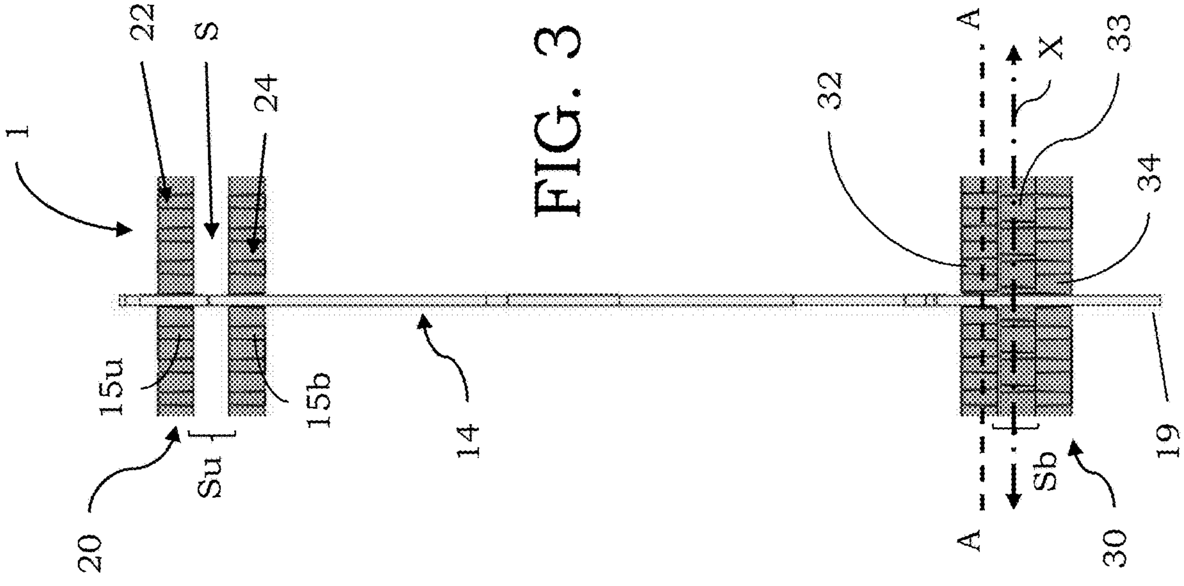
FIG. 3 shows a frontal, schematic and elevational view of the embodiment of FIG. 2.

Analogously, the lower plate-shaped support 30 may be configured with a first plate 32 and a second plate 34 parallel constrained at a pre-fixed distance from each other and with an additional plate 33 freely longitudinally sliding with respect to each other in a bidirectional way, according to a sliding direction X identified in FIG. 3.

Even more, the thickness "Su" of the additional plate 23 present between the first 22 and the second upper plate-shaped portions 24 may be different from the thickness "Sb" of the additional plate 33 present between the first 32 and the second lower plate-shaped portions 34.

The thickness of the additional plate 23 fixedly inserted between the upper plate-shaped portions 22 and 24 is equal to the separation distance "Su" between the plates themselves.

Analogously, the thickness of the additional plate 33 slidingly inserted between the lower plate-shaped portions 32 and 34 is equal to the separation distance "Sb" between the plates themselves, except for minimum tolerances to facilitate the sliding, and the distances "Su" and "Sb" may be different from each other.

The exemplary embodiment of FIG. 3 simply shows that the sliding additional plate may be provided in association with only one of the two upper or lower plate-shaped supports 20 or 30.

Advantageously, as previously mentioned and according to what is provided by the present disclosure, the additional plate 33 has openings 45 with a different port with respect to the hoes of the guide plates 20, 30. By the way, it would also be possible to create openings 45 with a section corresponding to those of the holes of the guide plates 20, 30, being it the minimum section, anyway modifiable through the overlapping clearance of openings and holes.

Even the openings 45 of the additional plate 33 are equal in number and order to the holes of the associated guide plate 30, once again said choice is not strictly necessary, being it possible, for instance, to create grooves on the additional plate which cooperate with the ports of several aligned holes 35 of the guide plate 30.

More particularly, in the illustrated embodiment the openings 45 have a passage port greater than that of the corresponding holes 15 or 35 of the guide plates 20 or 30.

It should be especially emphasized that, thanks to the possibility of narrowing the section of an insertion passage 50 defined by the alignment of the holes 35 and the openings 45, the above holes 35 may be made to house the probes 1 with a clearance greater than the one traditionally provided in the prior art devices, as exemplified in the comparison between FIGS. 3A and 3B.

In the examples herein described by way of non-limiting example, the openings of the several holes 15, 35, 45 are squared, but obviously nothing prevents them from being circular or differently shaped. In the examples they were assumed to be squared to correspond to the squared sections 16 of the probes 14. In FIGS. 3A and 3B for instance, reference number 16 indicates the section of the probe 14 at the section line A-A to indicatively represent the difference or the passage clearance through the holes 35 in the present invention.

For the sake of completeness of description, it should be noted that the holes 15 and 25 of the two upper and lower plate-shaped supports 20 or 30 are slightly truncated-pyramidal or in any case tapered.

This peculiarity also extends to the configuration wherein at least one of the guide plates 20 or 30 is structured with a first and a second plate-shaped portions 22, 24 or 32, 34 which are "sandwich"-configured and separated by a gap Su or Sb inside which said additional plate 23 and 33 is placed.

Figure 4A:
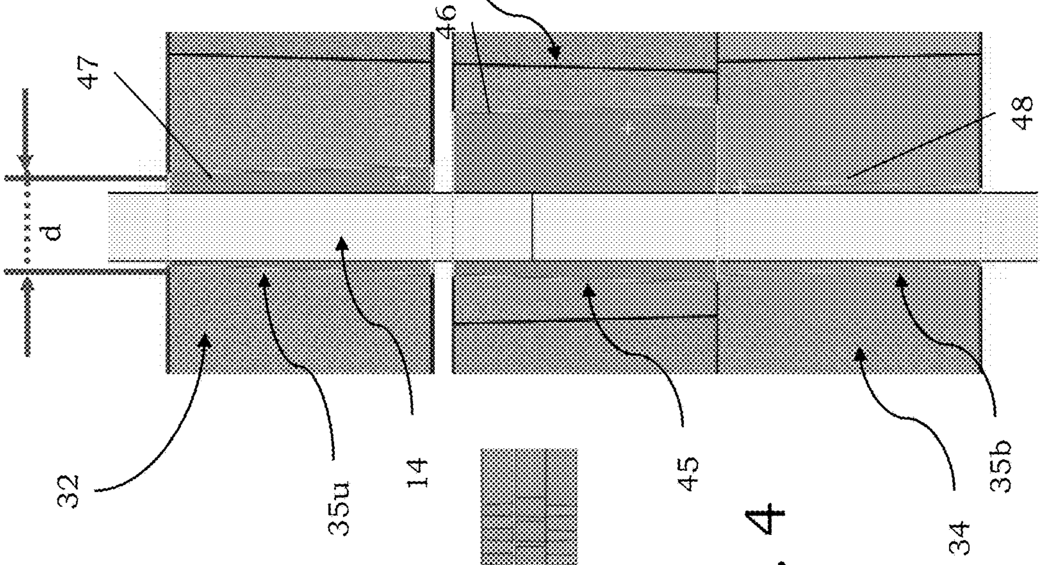
FIG. 4A shows a sectional, schematic and enlarged-scale view on a vertical plane of the details of FIG. 4
Figure 4:
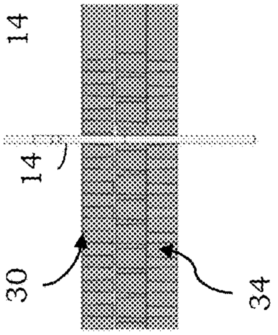
FIG. 4 shows a schematic sectional view on a vertical plane of a detail already shown in the example of FIG. 3 in an operating condition.

In the enlarged FIG. 4A, which is an enlarged-scale representation of FIG. 4 showing a lower detail of FIG. 3, the configuration of the holes 35*u* and 35*b* present in the respective plate-shaped portions 32, 34 is clearly visible in section. The holes 35*u*, which are defined as upper, have a downward flare, whereas the holes 35*b*, which are defined as lower, have an upward flare.

Actually, the two "sandwich"-structured plate-shaped portions 32, 34 have respective guide holes 35*u* and 35*b* which have opposite flares.

Figure 5A:
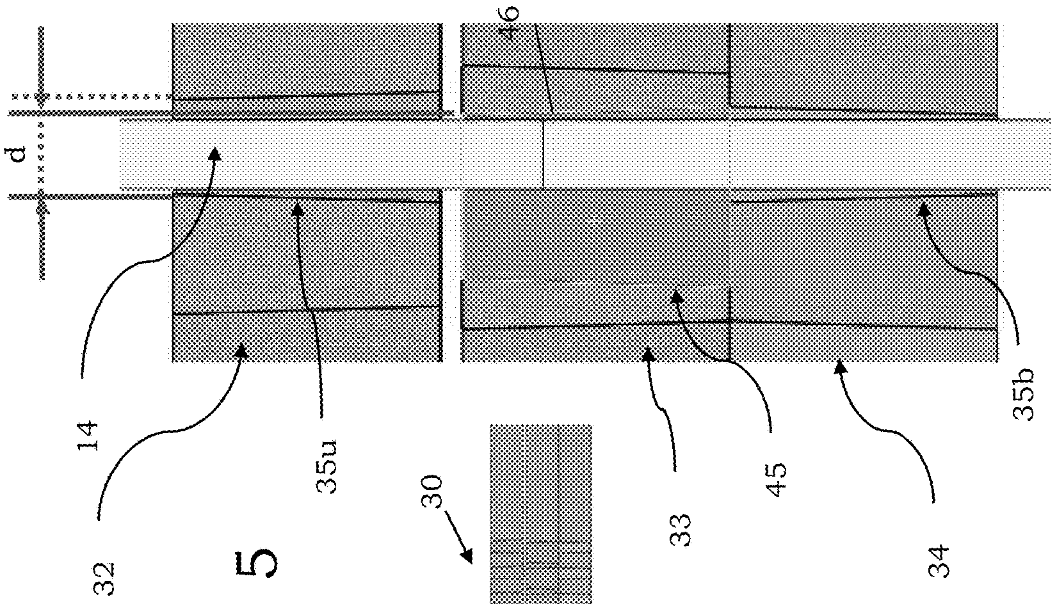
FIG. 5A shows a sectional, schematic and enlarged-scale view on a vertical plane of the details of FIG. 5.
Figure 5:
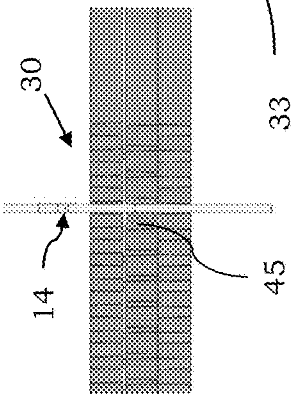
FIG. 5 shows a schematic sectional view on a vertical plane of a detail already shown in the example of FIG. 3 in another operating condition.

The example of FIGS. 4A and 5A with the enlargement that makes it greatly visible is focused on the two lower plate-shaped portions 32, 34, but the opposite flaring configuration may also be reproduced for the portions 22, 24 of the upper plate-shaped support 20. However, in FIG. 3 the holes 15*u* and 15*b* of the upper plate-shaped portions 22, 24 are shown with a flare having the same direction, from top to bottom, to demonstrate that the choice of orientation of the flare of the holes depends on the design choice of the desired sliding friction coefficient of the probes. In particular, the flare is preferably directed to facilitate the assembly procedure and to reduce the probability of jamming.

Still with reference to FIGS. 4A and 5A, the sectional enlargement further allows appreciating the different and wider size of the hole 45 of the sliding additional plate 33.

These holes 45 have a constant section and do not have a particular flare. Overall, their passage port is at least one and a half times greater than that of the corresponding holes 35*u* and 35*b* of the plates 32 and 34.

Now, analyzing the configuration of each probe 14, it can be appreciated that each probe essentially has a longitudinal extension that is by far prevalent with respect to the transversal dimension and is to be considered a slender stem 16 with a squared section. Other sections may obviously be adopted.

The stem 16 has an end tip 19, intended for the pressing contact against a termination of the device under test (DUT), and further has at least one first enlargement 17 and one second enlargement 18 in at least one transversal direction.

The purpose of these enlargements 17, 18 is a prerequisite for the sliding fastening of each probe 14 inside the respective housing and guide holes of the guide plates.

The first enlargement 17 transversely expands the overall dimensions of the stem 16 to a lesser extent than that of the second enlargement 18.

While representing an enlargement of a transversal dimension, the first enlargement 17 allows the probe 14 to pass through both holes 15 of the portions 22, 24 of the upper plate-shaped support 20 and the holes 35 of the portions 32, 34 of the lower plate-shaped support 30.

Instead, the second enlargement 18 only allows passing through the holes 15 of the first and second portions 22, 24 of the upper plate-shaped support 20, but not completely the holes 35 of the lower guide first and second portions 32, 34; this enlargement 18 abuts against these holes 35.

Figures 6, 6A:
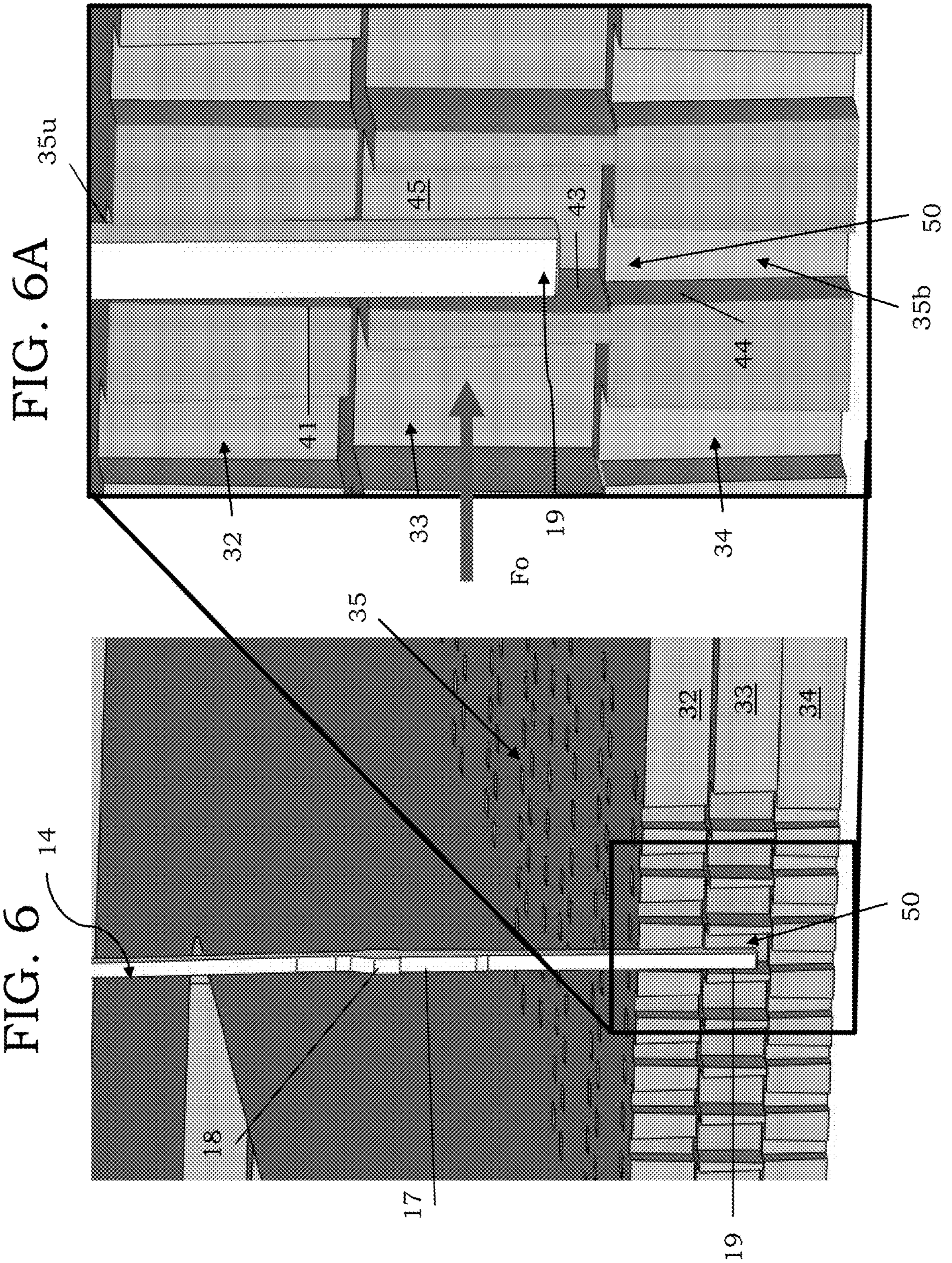
FIG. 6 shows a view of an embodiment of a testing head according to the present disclosure in subsequent steps of the method of assembly.
FIG. 6A shows a sectional and enlarged-scale views on a vertical plane of the details of FIG. 6.

With reference to FIG. 6 and following, the operation of the testing head 1 of the plate 23 or 33 sliding next to the plate-shaped portions 32, 34 in the assembly phase is now described.

During the assembly phase of the testing head 1, the probes 14 are even individually manipulated by means of a manipulator (not shown) in order to be able to insert and house them through the corresponding guide holes 15, 35, and 45 of the guide plates 20; 30.

In FIG. 6 a perspective view is shown wherein a probe 14 approaches one of the holes 35 of the first lower guide plate-shaped portion 32 with its own free end 19.

In this figure it is assumed that the probe 14 has already passed through the holes 15 of the first and second upper guide plate-shaped portion 22, 24, as shown for instance in FIG. 3.

For the purpose of functional description of the present disclosure, we will only focus on the lower part of the testing head 1, namely on the lower plate-shaped support 30 comprising the first and second plate-shaped guide portions 32, 34 and the sliding additional plate 33 intermediate therebetween.

In this phase, the foresight was previously taken to control the transversal sliding of the additional plate 33 in the direction of the arrow Fo which allows aligning an edge 43 of the opening 45 of this plate with the analogous edge 41, 44 of the holes 35*u* and 35*b* present in the respective first and second lower plate-shaped portions 32, 34.

In this way, as well visible in the enlargement of FIG. 6A, the head 19 of the probe easily passes through the upper hole 35*u* of the portion 32 and continues through the opening 45 of the additional plate 33 without encountering any obstacles to its translation from top to bottom.

This opening 45 is wider than the hole 35*u* and does not represent any obstacle to the advancement of the head 19 of the probe 14.

Figures 7, 7A:
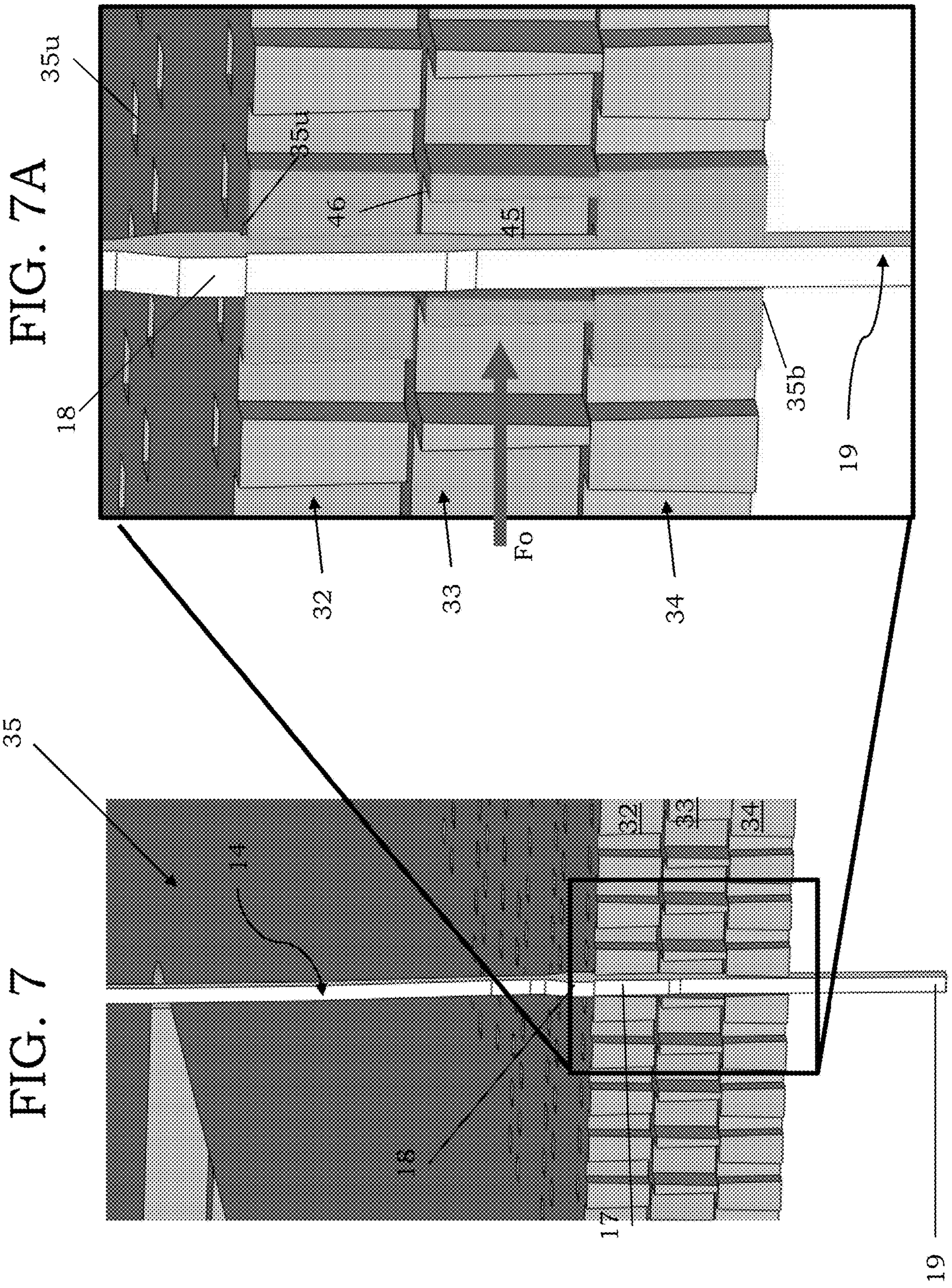
FIG. 7 shows a view of an embodiment of a testing head according to the present disclosure in subsequent steps of the method of assembly.
FIG. 7A shows a sectional and enlarged-scale views on a vertical plane of the details of FIG. 7.

In the analogous FIGS. 7 and 7A the further advancement of the tip of the probe 14 is shown, which continues inserting and completely also passes through the lower hole 35*b* of the second plate-shaped lower guide portion 34 to emerge at the bottom beyond said plate 34. Meanwhile, the greater enlargement 18 of the probe 14 abuts against the shallow edge of the hole 35*u* actually stopping the advancement of the probe 14.

Figure 8A:
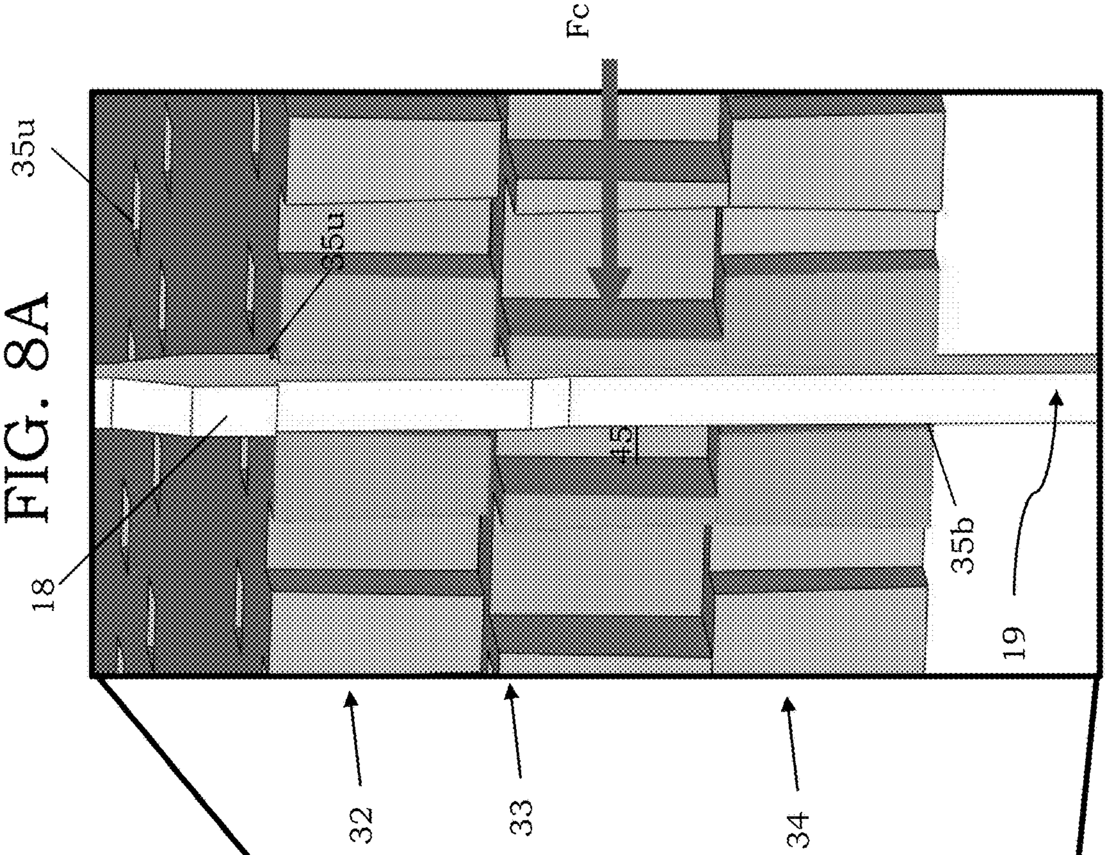
FIG. 8A shows a sectional and enlarged-scale views on a vertical plane of the details of FIG. 8.
Figure 8:
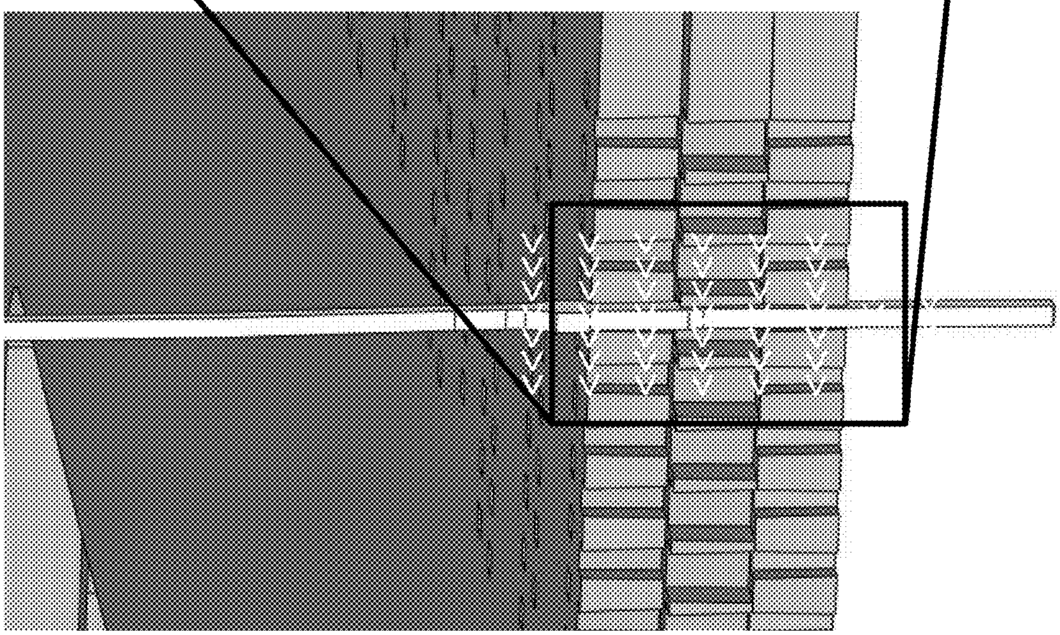
FIG. 8 shows a view of an embodiment of a testing head according to the present disclosure in subsequent steps of the method of assembly.

Finally, with reference to FIGS. 8 and 8A, it can be appreciated that a transversal sliding according to the arrow Fc of the additional intermediate plate 33 allows bringing the configuration of the entire lower plate-shaped support 30 in a use operating state wherein an edge 46 of the opening 45, opposite the edge 43, is translated so as to interfere at least with the passage port of the upper hole 35*u* of the first lower plate-shaped guide portion 32.

In other words, the additional plate 33 is slidingly guided between a first non-operating position, wherein the port of the passage openings 45 thereof is wider with respect to the projection of the port of the passage holes 35*u* or 35*b* of the first and second plate-shaped guide portions 32, 34 to an operating position wherein an edge 47 or 48 of the passage holes 35*u* or 35*b* of the guide plates 32, 34 masks, at least partially, said port of the opening 45 of the additional plate 33, as also shown in FIG. 5A.

The intermediate layer represented by the sliding additional plate 33 represents a sort of "latch" that has the possibility to translate in a longitudinal direction during the insertion and assembly phase of the probes 14 of the testing head 1.

The translation in the direction of the arrow Fo allows increasing the section of the resulting hole, namely the minimum section d of the insertion passage 50, useful for the passage of the probe 14 during the assembly phase, making the latter simpler.

Once assembly is complete, the additional plate 33 translates according to the direction of the arrow Fc in a closed, namely operating, position, thus reducing the resulting section of the lower receiving multiple hole 35*u*, 45, 35*b* (namely the insertion passage 50) of the probe 14. Actually, in this way the clearance of the probe 14 itself in its seat is reduced, thus increasing the precision of the assembled system and the cushioned operation regularity of the assembly represented by the totality of probes mounted in this way in the testing head.

The solution of the present disclosure thus solves the technical problem and achieves numerous advantages including: an improved ease of assembly with a particularly economic expedient and great structural and functional reliability.

In understanding the scope of the present invention, the term "comprising" and derivatives thereof, as herein used, are intended as open terms that specify the presence of the specified features, elements, components, groups, integers and/or steps, but do not exclude the presence of other non-specified features, elements, components, groups, integers and/or steps. The foregoing also applies to words with similar meanings such as the terms "including", "having" and derivatives thereof. Moreover, the terms "part", "section" and "portion", when used in the singular form, may have the double meaning of a single part or of a plurality of parts unless otherwise specified.

It will also be understood that, although the terms "first" and "second" may be herein used to describe several components, these components should not be limited by these terms. These terms are only used to distinguish one component from another.

Although only selected embodiments were chosen to illustrate the present invention, it will be clear to the skilled persons from this disclosure that several changes and modifications may be herein performed without departing from the scope of the invention as defined in the appended claims.

The invention claimed is:

1. A testing head with vertical probes for a probe card, the testing head comprising:

at least one pair of guide plates arranged parallel to each other in a prefixed, spaced-apart relation, and provided with a plurality of guide and housing holes;

a plurality of contact probes housed and extended between corresponding holes of said guide plates; and at least one additional plate slidingly associated next to one or the other of said guide plates and provided with a plurality of openings which define, in continuity with the holes of the associated guide plate, insertion passages for said probes, wherein the sliding of the additional plate with respect to the associated guide plate modifies a minimum section of said insertion passages;

wherein a narrower section of said openings has an axial extension, measured along a sliding direction of the additional plate, greater than that of the holes of the associated guide plate; and wherein the guide plate associated with the additional plate comprises first and second plate-shaped portions which are parallel to each other and which are separated by a gap in which said additional plate slides.

2. The testing head according to claim 1, wherein said openings are a plurality of openings corresponding to the plurality of holes of the associated guide plate.

3. The testing head according to claim 1, wherein said openings have at least one rectilinear edge perpendicular to the sliding direction.

4. The testing head according to claim 1, wherein thickness of the gap between the plate-shaped portions corresponds to thickness of the additional plate, net of the clearance necessary for sliding.

5. The testing head according to claim 1, wherein the holes of the guide plate associated with the additional plate are equally present, in a substantially aligned manner, on the first and on the second plate-shaped portions.

6. The testing head according to claim 1, wherein each of the two guide plates comprises first and a second plate-shaped portions parallel to each other and separated by a respective gap in which a corresponding additional plate slides.

7. The testing head according to claim 6, wherein thickness of the gap between each pair of first and second plate-shaped portions corresponds to thickness of the related additional plate.

8. The testing head according to claim 1, wherein said additional plate is slidingly guided between a non-operating position and an operating position, wherein a minimum section in the non-operating position is greater than a minimum section in the operating position.

9. The testing head according to claim 8, wherein said openings have opposite edges in a sliding direction of the additional plate; wherein in said operating position one of said edges partially masks a port from the holes of the guide plate associated with the additional plate.

10. The testing head according to claim 1, wherein the sliding of said at least one additional plate is bidirectional.

11. The testing head according to claim 1, wherein the probes have at least one transversal enlargement capable of preventing a complete crossing of at least one of the guide holes of one of said guide plates.

12. The testing head according to claim 1, wherein the respective guide holes of the parallel guide plates are offset from each other.

13. A method of assembly of a testing head with vertical probes for a probe card, comprising the steps of:

providing at least one pair of guide plates arranged parallel to each other in a prefixed, spaced-apart relation, and provided with a plurality of guide and housing holes;

providing at least one additional plate slidingly associated next to one or the other of said guide plates and provided with a plurality of openings which define, in continuity with the holes of the associated guide plate, insertion passages for probes, wherein the sliding of the additional plate with respect to the associated guide plate modifies a minimum section of said insertion passages;

bringing said additional plate into a non-operating position, in which a minimum section of said insertion passages is maximum;

introducing a plurality of contact probes into the corresponding holes of said guide plates, and passing through said insertion passages; and bringing said additional plate into an operating position, in which a minimum section of said insertion passages, within which the probes are housed, is minimum;

wherein a narrower section of said openings has axial extension, measured along a sliding direction of the additional plate, greater than that of the holes of the associated guide plate; and wherein the guide plate associated with the additional plate comprises first and second plate-shaped portions which are parallel to each other and which are separated by a gap in which said additional plate slides.

* * * * *